United States Patent
Cutter et al.

(10) Patent No.: US 6,686,790 B2
(45) Date of Patent: *Feb. 3, 2004

(54) LOW CURRENT REDUNDANCY ANTI-FUSE METHOD AND APPARATUS

(75) Inventors: Douglas J. Cutter, Boise, ID (US); Kurt D. Beigel, Boise, ID (US); Fan Ho, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 342 days.

This patent is subject to a terminal disclaimer.

(21) Appl. No.: 09/794,707

(22) Filed: Feb. 27, 2001

(65) Prior Publication Data

US 2001/0006351 A1 Jul. 5, 2001

(Under 37 CFR 1.47)

Related U.S. Application Data

(62) Division of application No. 09/370,831, filed on Aug. 9, 1999, which is a continuation of application No. 08/896,490, filed on Jul. 18, 1997, which is a division of application No. 08/724,851, filed on Oct. 3, 1996, now Pat. No. 6,023,431.

(51) Int. Cl.[7] .......................... H01H 37/76; H01H 85/00
(52) U.S. Cl. ..................................................... 327/525
(58) Field of Search ................................. 327/525, 526

(56) References Cited

U.S. PATENT DOCUMENTS

| | | | |
|---|---|---|---|
| 4,686,384 A | 8/1987 | Harvey et al. ............ 307/202.1 |
| 5,003,511 A | 3/1991 | Secol et al. ............. 365/189.07 |
| 5,099,149 A | 3/1992 | Smith .......................... 307/465 |
| 5,148,391 A | 9/1992 | Zagar ........................... 365/96 |
| 5,194,759 A | 3/1993 | El-Ayat et al. ........... 307/202.1 |
| 5,200,922 A | 4/1993 | Rao ............................. 365/200 |
| 5,243,226 A | 9/1993 | Chan ........................... 307/465 |
| 5,264,725 A | 11/1993 | Mullarkey et al. .......... 257/665 |
| 5,315,177 A | 5/1994 | Zagar et al. ................ 307/465 |
| 5,341,267 A | 8/1994 | Whitten et al. ............... 361/56 |
| 5,387,823 A | 2/1995 | Ashizawa ..................... 326/13 |
| 5,424,655 A | 6/1995 | Chua ........................... 326/40 |
| 5,424,672 A | 6/1995 | Cowles et al. .............. 327/525 |
| 5,488,317 A | 1/1996 | Webster et al. ................ 326/45 |
| 5,508,638 A | 4/1996 | Cowles et al. ................ 326/38 |
| 5,508,969 A | 4/1996 | Johnson et al. ........ 365/230.06 |
| 5,566,107 A | 10/1996 | Gilliam ....................... 365/200 |
| 5,657,293 A | 8/1997 | Merritt et al. ........... 365/233.5 |
| 5,696,723 A | 12/1997 | Tukahara ..................... 365/200 |
| 5,838,625 A | 11/1998 | Cutter et al. ............. 365/225.7 |
| 5,841,723 A | 11/1998 | Ma ........................... 365/225.7 |
| 5,847,987 A | 12/1998 | Cutter et al. .................. 365/96 |
| 5,889,414 A | 3/1999 | Li et al. ........................ 326/49 |
| 5,926,034 A | 7/1999 | Seyyedy ....................... 326/37 |
| 5,945,840 A | 8/1999 | Cowles et al. ................ 326/38 |
| 5,973,978 A | 10/1999 | Cutter et al. ............. 365/225.7 |

*Primary Examiner*—Terry D. Cunningham
*Assistant Examiner*—Quan Tra
(74) *Attorney, Agent, or Firm*—Schwegman, Lundberg, Woessner & Kluth P.A.

(57) ABSTRACT

A programmable circuit includes a first node and provides a programmed signal based on the state of the first node. A first anti-fuse has a programmed state and an unprogrammed state and couples the first node to a first power supply when in the programmed state and decouples the first node from the first power supply when in the unprogrammed state. A second anti-fuse has a programmed state and an unprogrammed state and couples the first node to a second power supply when in the programmed state and decouples the first node from the second power supply when in the unprogrammed state. The state of the programmed signal can be used to replace a primary circuit element of an integrated circuit with a redundant circuit element.

36 Claims, 3 Drawing Sheets

LOW CURRENT REDUNDANCY ANTI-FUSE METHOD AND APPARATUS

This application is a Divisional of U.S. application Ser. No. 09/370,831 filed Aug. 9, 1999 which is a Continuation of U.S. application Ser. No. 08/896,490 filed Jul. 18, 1997 which is a Divisional of U.S. Ser. No. 08/724,851 filed Oct. 3, 1996 now U.S. Pat. No. 6,023,431.

THE FIELD OF THE INVENTION

The present invention relates generally to integrated circuits, and more particularly to fuse-controlled programmable circuits used to replace primary circuit elements with redundant circuit elements in integrated circuits such as memory integrated circuits.

BACKGROUND OF THE INVENTION

Technological advances have permitted semiconductor integrated circuits to comprise significantly more circuit elements in a given silicon area. Reducing and eliminating defects in the circuit elements has, however, become increasingly more difficult with the increased number of circuit elements. To achieve higher population capacities, circuit designers strive to reduce the size of the individual circuit elements to maximize available die real estate. The reduced size makes these circuit elements increasingly susceptible to defects caused by material impurities during fabrication. Nevertheless, the defects are identifiable upon completion of the integrated circuit fabrication by testing procedures, either at the semiconductor chip level or after complete packaging. Scrapping or discarding defective integrated circuits when defects are identified is economically undesirable, particularly if only a small number of circuit elements are actually defective.

Relying on zero defects in the fabrication of integrated circuits is an unrealistic option. Therefore, redundant circuit elements are provided on integrated circuits to reduce the number of scrapped integrated circuits. If a primary circuit element is determined to be defective, a redundant circuit element is substituted for the defective primary circuit element. Substantial reductions in scrap are achieved by using redundant circuit elements without substantially increasing the cost of the integrated circuit.

One type of integrated circuit device which uses redundant circuit elements is integrated memory circuits, such as dynamic random access memories (DRAMs), static random access memories (SRAMs), video random access memories (VRAMs), and erasable programmable read only memories (EPROMs). Typical integrated memory circuits comprise millions of equivalent memory cells arranged in arrays of addressable rows and columns. The rows and columns of memory cells are the primary circuit elements of the integrated memory circuit. By providing redundant circuit elements, either as rows or columns, defective primary rows, columns, or individual bits can be replaced.

Because the individual primary circuit elements (rows or columns) of an integrated memory circuit are separately addressable, replacing a defective circuit element typically entails blowing fuses or anti-fuses in fuse-controlled programmable circuits to "program" a redundant circuit element to respond to the address of the defective primary circuit element. This process is very effective for permanently replacing defective primary circuit elements.

In the case of DRAMs, for example, a particular memory cell is selected by first providing a unique row address of the row in which the particular memory cell is located and subsequently providing a unique column address of the column in which the particular memory cell is located. Redundancy circuitry must recognize the address of the effective primary circuit element and reroute all signals to the redundant circuit element when the address to the defective primary circuit element is presented by the user. Therefore, a number of fuses or anti-fuses are associated with each redundant circuit element. The possible combinations of blown and unblown fuses corresponding to each redundant circuit element represent unique addresses of all primary circuit elements for which a corresponding redundant circuit element may be substituted.

During testing of the DRAM, or other integrated circuit, at the factory, any defective primary circuit elements are identified. A suitable redundant circuit element is selected, and the corresponding fuses or anti-fuses are blown in a predetermined order to represent the address of the defective primary circuit element to be replaced. When using the DRAM, each address provided to the DRAM must be compared to the corresponding fuses or anti-fuses to determine if a redundant match is present. Whenever the redundant match is detected, the primary circuit element is suppressed and the redundant circuit element is activated to perform the required function.

As mentioned above, fuses or anti-fuses can be used in the fuse-controlled programmable circuits. In a DRAM, an anti-fuse is typically a nitrite capacitor which is essentially a normal memory array cell used as a blowable capacitor. Thus, no extra process steps are required in the fabrication of a DRAM to produce an anti-fuse. Unlike the fuse which is open after being blown, the anti-fuse is typically a one-time blowable or programmable element which remains shorted when the circuit is powered down and re-powered up. One problem with an anti-fuse controlled programmable circuit is that once the fuse has been blown (or shorted), current is drawn through the anti-fuse. As more programmable anti-fuse circuits are disposed in an integrated circuit, and programmed by blowing the anti-fuses, the cumulative current drawn through the anti-fuses can be significant and can possibly affect the operation of the integrated circuit.

Conventional anti-fuse controlled programmable circuits use long-L p-channel transistors to pull up anti-fuses. The long-L p-channel transistor effectively decreases the amount of current drawn through a blown (shorted) anti-fuse to ground. Nevertheless, the resulting standby and operating current due to a resistor short between the power rail and ground when anti-fuses have been programmed is still somewhat significant. Moreover, the long-L p-channel transistor of existing anti-fuse structures occupies significant real estate in the integrated circuit. Thus, although the length of the pull-up "long-L" p-channel transistor can be increased to decrease the current drawn between the power rail and ground, the increased length results in even more area being occupied by the long-L p-channel transistors of the anti-fuse controlled programmable circuits.

Therefore, there is a need in the art for an anti-fuse controlled programmable circuit which substantially eliminates or significantly reduces the resulting standby current from blown or programmed anti-fuses. Moreover, there is a need for an improved anti-fuse controlled programmable circuit which occupies less area in the integrated circuit.

SUMMARY OF THE INVENTION

The present invention provides a programmable circuit coupled to a first power supply and a second power supply for providing a programmed signal in an integrated circuit The programmable circuit includes a first node. The state of the programmed signal is based on the state of the first node. A first anti-fuse has a programmed state and an unprogrammed state and couples the first node to the first power supply when in the programmed state and decouples the first node from the first power supply when in the unprogrammed state. A second anti-fuse has a programmed state and an unprogrammed state and couples the first node to the second power supply when in the programmed state and decouples the first node from the second power supply when in the unprogrammed state.

In one embodiment of the programmable circuit according to the present invention, the first anti-fuse and the second anti-fuse each include a first terminal and a second terminal. The first terminals of the first and second anti-fuses are coupled to the first node. A first programming bus carries a sufficient voltage to short the first anti-fuse. A first switch is coupled to the second terminal of the first anti-fuse and couples the second terminal of the first anti-fuse to the first power supply during normal operation of the integrated circuit and couples the second terminal of the first anti-fuse to the first programing bus during a first programming operation of the integrated circuit for programming the first anti-fuse. A second programming bus carries a sufficient voltage to short the second anti-fuse. A second switch is coupled to the second terminal of the second anti-fuse and couples the second terminal of the second anti-fuse to the second power supply during normal operation of the integrated circuit and couples the second terminal of the second anti-fuse to the second programing bus during a second programming operation of the integrated circuit for programming the second anti-fuse.

In one embodiment of the present invention the second power supply comprises a ground node and the programmable circuit includes a switch coupled between the ground node and the first node. The switch is responsive to at least one programming control signal received by the programmable circuit. The switch is closed to couple the first node to the ground node during a programming operation of the integrated circuit and open during normal operations of the integrated circuit The switch preferably is implemented in a transistor.

In one embodiment of the present invention the second power supply comprises a ground node and the programmable circuit includes a switch coupled between the ground node and the first node. The switch is responsive to an enable signal received by the programming circuit. The switch is closed to couple the first node to the ground node based on the enable signal being in a first state. The switch is open based on the enable signal being in a second state. The switch preferably is implemented in a transistor.

In one application of the present invention the integrated circuit includes primary circuit elements, such as memory cells of a memory integrated circuit. The integrated circuit also includes at least one redundant circuit element A selected one of the primary circuit elements is replaceable by the at least one redundant circuit element based on the state of the programmed signal.

The programmable circuit according to the present invention includes two anti-fuses, with only one of the two anti-fuses being programmed, instead of a single anti-fuse to produce two states on the programmed signal. In the programmable circuit of the present invention, no resistive short exists between the power supply and ground after the programming the programmable circuit, because only one of the two anti-fuses is programmed which leaves the unprogrammed anti-fuse open. This substantially decreases or substantially eliminates current drawn through a blown or shorted anti-fuse to ground. This also eliminates the need for long-L p-channel transistors to pull up the anti-fuses, which provides a substantial area saving in the integrated circuit employing numerous programmable circuits according to the present invention.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

The following described embodiments of the present invention are described as applied to a dynamic random access memory (DRAM). The present invention is not limited to DRAMs, as the present invention is equally applied to other memory devices such as static random access memories (SRAMs), video random access memories (VRAMs), and erasable programmable read only memories (EPROMs). In fact, the present invention can be applied to any electronic integrated circuit having primary and redundant circuitry comprising separately addressable circuit elements.

Example DRAM Configuration

Figure 1C:
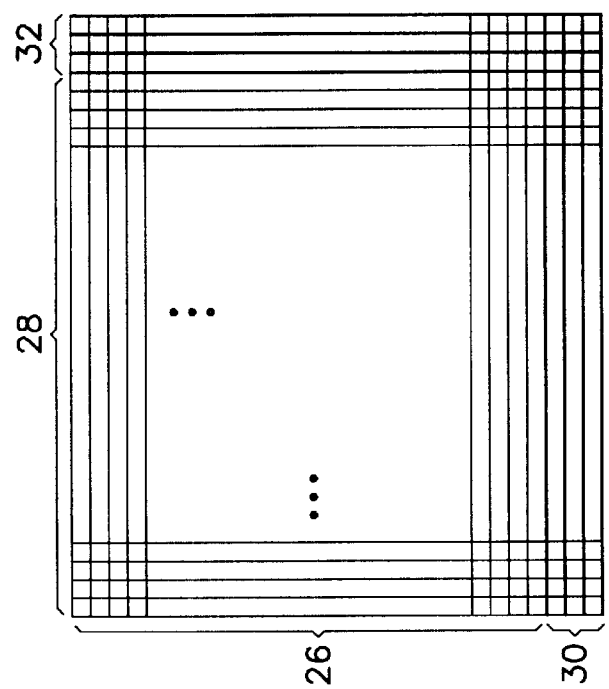
FIGS. 1A–1C are illustrations of a suitable configuration of a 64 megabit DRAM having redundancy circuitry according to the present invention.
Figure 1B:
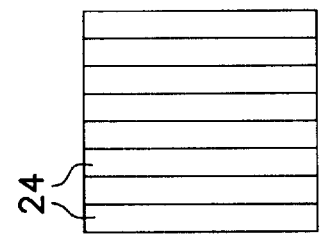
Figure 1A:
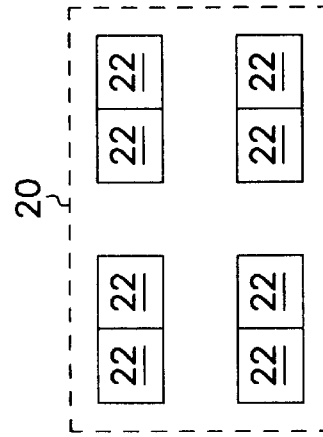

Addressable memory cells of a 64 megabit DRAM according to the present invention are illustrated generally at 20 in FIG. 1A. The 64 megabit DRAM according to the present invention is similar in many respects to conventional DRAMs, such as those commercially available from Micron Technology, Inc. of Boise, Id. For clarity, only a portion of the well known circuitry of the DRAM is described herein, while the new circuitry of the DRAM of the present invention is described in detail herein. As illustrated in FIG. 1A, the 64 megabit DRAM includes eight sections 22. As in FIG. 1B, each section 22 includes eight sub-sections or arrays 24. As illustrated in FIG. 1C, each array 24 includes one megabit of memory cells arranged in 512 addressable primary rows or circuit elements 26 and 2048 addressable primary columns or circuit elements 28.

In addition, in the embodiment of the 64 megabit DRAM according to the present invention illustrated in FIGS.

1A–1C, each array 24 includes four addressable redundant rows or circuit elements 30 and four addressable redundant columns or circuit elements 32. Four redundant rows and four redundant columns are shown in FIG. 1C for illustrative purposes only, and the exact number of redundant circuit elements included in a DRAM or other integrated circuit according to the present invention is determined based on known design criteria Each primary row 26 is uniquely addressable. Thus, any one of the primary rows 26 in the DRAM can be addressed using twelve address lines (i.e., nine address lines corresponding to the 512 primary rows 26 and three address lines corresponding to the eight sections 22). If testing procedures indicate that a primary row is defective, a redundant row 30 is "programmed" to replace the defective primary row 26. This is accomplished by programming a redundant row 30 to respond to the address corresponding to the defective primary row 26.

Each primary column 28 is also uniquely addressable. Thus, any one of the primary columns 28 in the DRAM can be addressed using fourteen address lines (i.e., eleven address lines corresponding to the 2048 primary columns 28 and three address lines corresponding to the eight arrays 24). If testing procedures indicate that a primary column is defective, a redundant column 32 is "programmed" to replace the defective primary column 28. This is accomplished by programing a redundant column 32 to respond to the address corresponding to the defective primary column 28.

Match Anti-Fuse Bank Circuit

Figure 2:
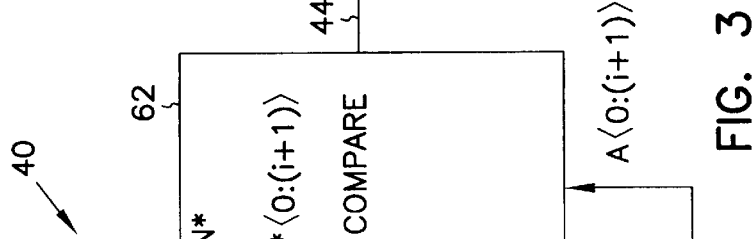
FIG. 2 is a block diagram of match anti-fuse bank circuit according to the present invention, which is employed in the DRAM partially illustrated in FIGS. 1A–1C.

Referring to FIG. 2, each of the four redundant rows 30 and each of the four redundant columns 32 of each array 24 includes a corresponding multi-bit address/anti-fuse comparison circuit module or match anti-fuse bank circuit 40 according to the present invention. Each match anti-fuse bank circuit 40 is capable of receiving a multi-bit address signal, indicated at 42, in the form of a pro-decoded signal or a non-predecoded signal depending on the embodiment of the match anti-fuse bank. The address signal 42 is used to address the primary rows 26 at one time and the primary columns at a subsequent time based on the state of selected command input signals to the DRAM. Each match anti-fuse bank circuit 40 is selectively programmable to respond to a specific value of the address signal 42. Each match anti-fuse bank circuit 40 evaluates the address signal 42 and activates a match signal, indicated at 44, if the row address value of address signal 42 corresponds to the address of a defective primary row 26 which the match anti-fuse bank circuit is programmed to replace. Similarly, each match anti-fuse bank circuit 40 activates the match signal 44 if the column address value of address signal 42 corresponds to the address of a defective primary column 28 which the match anti-fuse bank circuit is programmed to replace.

The match signal 44, when activated by the corresponding match anti-fuse bank circuit 40, causes the associated redundant row 30 or the associated redundant column 32 to be accessed. The activated match signal 44 also disables the associated defective primary row 26 or the associated primary column 28 such that the associated defective primary row or column cannot respond to the address signal 42.

Figure 3:
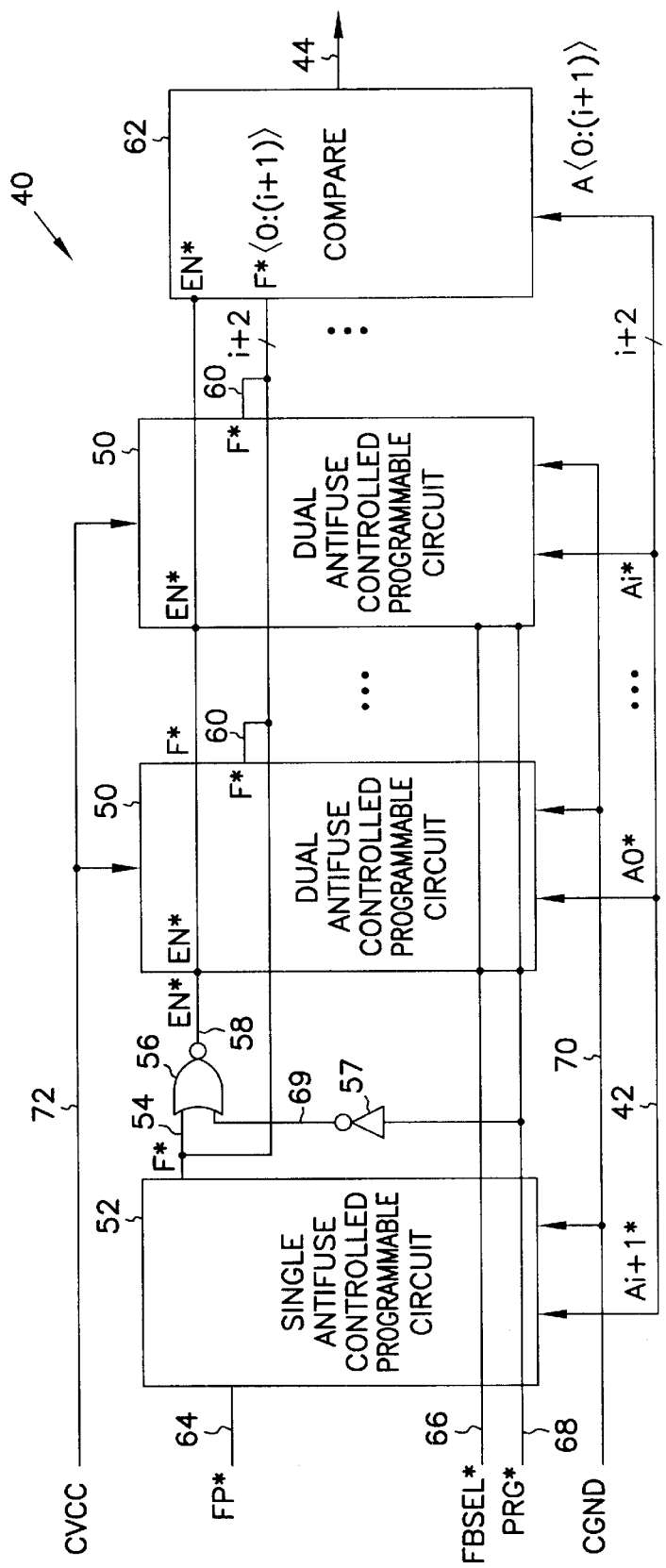
FIG. 3 is a more detailed block diagram of the match anti-fuse bank of circuit of FIG. 2.

A more detailed schematic diagram of match anti-fuse bank circuit 40 is illustrated in FIG. 3. As illustrated in FIG. 3, match anti-fuse bank 40 comprises 'i' dual anti-fuse controlled programmable circuits 50 to correspond to address bits A0* through Ai* received from address signal 42. Match anti-fuse bank 40 also comprises a single anti-fuse controlled programmable circuit 52 to receive a high-order address bit $A_{i+1}*$ from address signal 42.

A fuse program (FP*) signal derived from the row address strobe (RAS) signal to the DRAM is provided on a line 64 to single anti-fuse controlled programmable circuit 52. A fuse bank select (FBSEL*) signal is provided on a line 66 to single anti-fuse controlled programmable circuit 52 and to all dual anti-fuse controlled programmable circuits 50 on a line 66. FBSEL* is typically a high-order address bit which is low when the particular fuse bank is selected for programming. A test mode signal (PRG*) which indicates that anti-fuses can be programmed when low, is provided on a line 68 to single anti-fuse controlled programmable circuit 52 and to all dual anti-fuse controlled programmable circuits 50.

Single anti-fuse controlled programmable circuit 52 provides a F* signal on a line 54. The F* signal on line 54 is provided to one input of a two input NOR gate 56. An inverter 57 inverts the PRG* signal to produce a PRG signal on a line 69. The PRG signal on line 69 is provided to the other input of NOR gate 56. NOR gate 56 provides an EN* (enable) signal on a line 58 to all of the dual anti-fuse controlled programmable circuits 50. When the EN* signal is low, the dual anti-fuse controlled programmable circuits 50 are enabled for programming. Each of the dual anti-fuse controlled programmable circuits 50 provide a corresponding F* signal on a corresponding line 60 which are all provided to a compare logic circuit 62 along with the F* signal on line 54 from single anti-fuse controlled programmable circuit 52. In addition, the EN* signal on line 58 and address inputs A<0:(i+1)> on line 42 are also provided to compare logic circuit 62. Compare logic circuit 62 provides the match signal indicated at 44, which is activated if every single address input A0–Ai+1 matches the corresponding state of the corresponding anti-fuses in the anti-fuse controlled programmable circuits 50 and 52 as indicated by the F* signals.

A program/ground CGND bus 70 is provided to single anti-fuse controlled programmable circuit 52 and to all dual anti-fuse controlled programmable circuits 50. In addition, a program/power CVCC bus 72 is provided to all dual anti-fuse controlled programmable circuits 50. The operation of the CGND bus 70 and the CVCC bus 72 are described below in reference to FIGS. 4 and 5.

Single Anti-Fuse Controlled Programmable Circuit for Enable Bit

Figure 4:
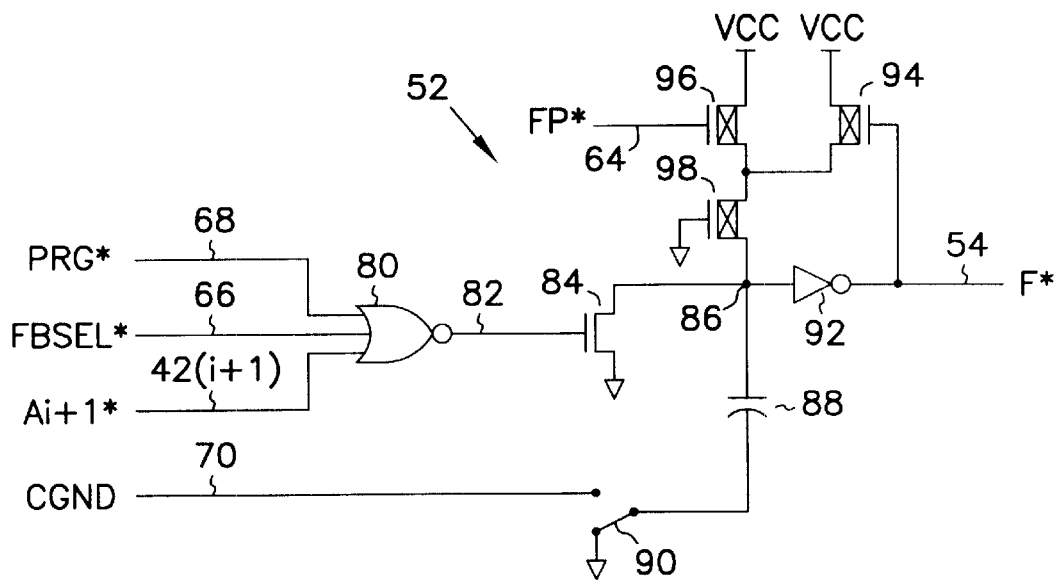
FIG. 4 is a schematic diagram of a single anti-fuse controlled programmable circuit employed in the match anti-fuse bank of FIG. 2 for generating an enable bit.

Single anti-fuse controlled programmable circuit 52 is illustrated in more detail in schematic diagram form in FIG. 4. The layout of single anti-fuse controlled programmable circuit 52, as illustrated in FIG. 4, is similar to conventional anti-fuse controlled programmable circuits for the individual address bits of prior art match anti-fuse bank circuits. Single anti-fuse controlled programmable circuit 52, however, is used to generate the EN* signal on line 58 in the match anti-fuse bank circuit 40 according to the present invention.

As illustrated in FIG. 4, a three input NOR gate 80 receives the PRG* signal on line 68, the FBSEL* signal on line 66, and the Ai+1* signal on line 42 (i+1) and activates an output line 82 when all three input signals are a low-logic level. The output of NOR gate 80 on line 82 is provided to the gate of an n-channel transistor 84. The source of n-channel transistor 84 is coupled to a ground node. The drain of n-channel transistor 84 is coupled to a node 86. With the PRG*, FBSEL* and the Am* signals all low, line 82 becomes high to turn transistor 84 on. With transistor 84 on, node 86 is effectively coupled to the ground node.

An anti-fuse 88 has one of its terminals coupled to node 86 and its other terminal coupled to a switch 90. Switch 90 switches between a ground node and the CGND bus 70. During programming, the switch 90 switches to the CGND bus 70 and during normal operations, switch 90 switches to the ground node. In this way, during programming one terminal of anti-fuse 88 is coupled to a ground level at node 86 and the other terminal is coupled to the CGND bus 70. In programming anti-fuse 88, a high voltage such as 10 volts, or the voltage needed to exceed the breakdown voltage of anti-fuse 88 to permanently short anti-fuse 88, is provided on the CGND bus 70.

Node 86 is also coupled to the input of an inverter 92 which supplies the F* signal on line 54 from single anti-fuse controlled programmable circuit 52. The F* signal is coupled to the gate of a p-channel transistor 94. The source of p-channel transistor 94 is coupled to the Vcc power supply. The FP* signal on line 64 is provided to the gate of a p-channel transistor 96. The source of p-channel transistor 96 is coupled to the Vcc power supply. The drains of p-channel transistors 94 and 96 are coupled together and coupled to the source of a long-L p-channel pull-up transistor 98. The gate of long-L p-channel pull-up transistor 98 is coupled to ground. The drain of long-L p-channel pull-up transistor 98 is coupled to node 86.

In operation, when anti-fuse 88 is not programmed (open), node 86 is pulled toward VCC to provide a low or zero output on the F* line 54. Thus, the EN* signal, which is an inverted version of the F* signal on line 54 when the PRG signal on line 69 is low, is at a high level when the "enable" anti-fuse 88 is not blown or programmed. When anti-fuse 88 is programmed (shorted), node 86 is pulled to the ground level, which when inverted by inverter 92, produces a high or one output on the F* line 54. Thus, the EN* signal, which is an inverted version of the F* signal on line 54 when the PRG signal on line 69 is low, is at a low level to enable programming of the dual anti-fuse controlled programmable circuits 50 after "enable" anti-fuse 88 is blown.

Dual Anti-Fuse Controlled Programmable Circuit

Figure 5:
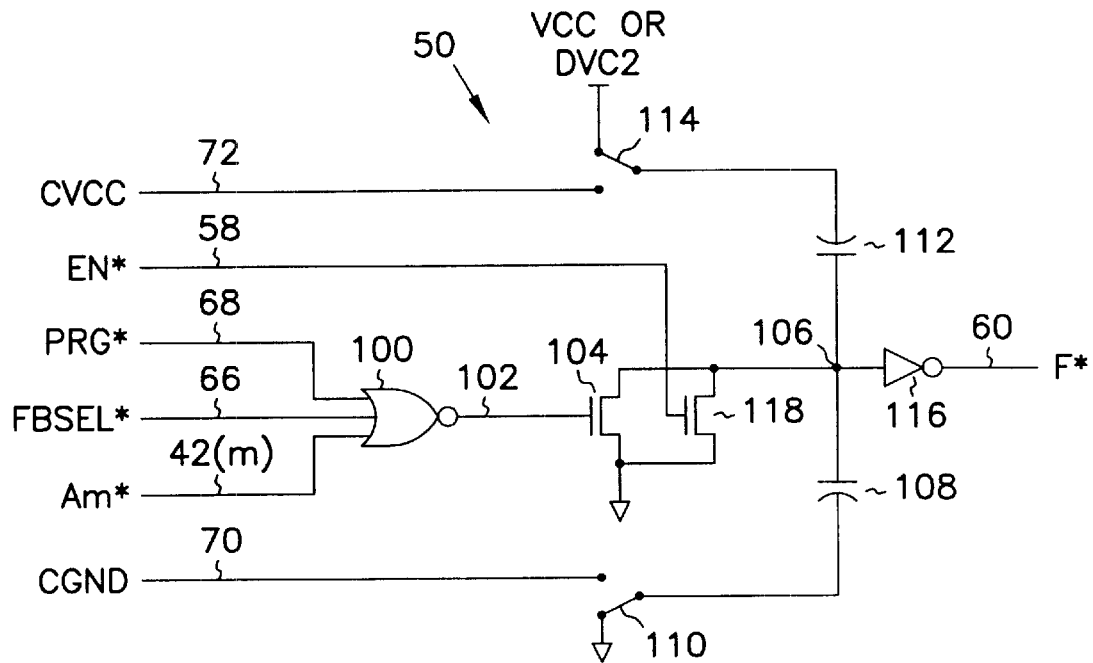
FIG. 5 a schematic diagram of a dual anti-fuse controlled programmable circuit employed in the match anti-fuse bank of FIG. 2.

Dual anti-fuse controlled programmable circuit 50 is illustrated in more detail in schematic diagram form in FIG. 5. As illustrated in FIG. 5, a NOR gate 100 receives the PRG* signal on line 68, the FBSEL* signal on line 66, and an individual address bit indicated by Am* on the 42(m) line. NOR gate 100 activates an output line 102 when all three inputs are low. The output of NOR gate 100 on line 102 is coupled to the gate of an n-channel transistor 104. The source of n-channel transistor 104 is coupled to ground. The drain of n-channel transistor 104 is coupled to a node 106. With the PRG*, FBSEL* and the Am* signals all low, line 102 becomes high to turn transistor 104 on with transistor 104 on, node 106 is effectively coupled to the ground node.

An anti-fuse 108 has one of its terminals coupled to node 106 and its other terminal coupled to a switch 110. Switch 110 switches between a ground node and the CGND bus 70. During programming, the switch 110 switches to the CGND bus 70 and during normal operations, switch 110 switches to the ground node. In this way, during programming one terminal of anti-fuse 108 is coupled to a ground level at node 106 and the other terminal is coupled to the CGND bus 70. In programming anti-fuse 108, a high voltage such as 10 volts, or the voltage needed to exceed the breakdown voltage of anti-fuse 108 to permanently short anti-fuse 108, is provided on the CGND bus 70.

An anti-fuse 112 has one of its terminals coupled to node 106 and its other terminal coupled to a switch 114. Switch 114 switches between a ground node and the CVCC bus 72. During programming, the switch 114 switches to the CVCC bus 72 and during normal operations, switch 114 switches to the Vcc power supply or a DVC2 power supply. In this way, during programming one terminal of anti-fuse 112 is coupled to a ground level at node 106 and the other terminal is coupled to the CVCC bus 72. In programming anti-fuse 112, a high voltage such as 10 volts, or the voltage needed to exceed the breakdown voltage of anti-fuse 112 to permanently short anti-fuse 112, is provided on the CVCC bus 72.

As indicated above, in one embodiment of the present invention, one terminal of anti-fuse 112 is coupled to DVC2, having a Vcc/2 level, instead of the full Vcc power supply. In this embodiment, the Vcc/2 potential across anti-fuse 112 reduces or substantially eliminates potential reliability problems that can result from having a full Vcc potential across anti-fuse 112. However, with anti-fuse 112 tied to DVC2, or other lower voltage than Vcc, the output inverter 116 needs to be skewed to operate at a reduced input swing voltage.

Node 106 is also coupled to an inverter 116. Inverter 116 inverts the state on node 106 and provides the F* signal on the line 160 for the individual address bit Am*.

The EN* signal, as stated above, is high before the enable fuse 88 of single anti-fuse controlled programmable circuit 52 is programmed. The EN* signal being high prevents inverter 116 from having a floating input at node 106. The EN* signal is provided from line 58 to the gate of an n-channel transistor 118. N-channel transistor 118 has its source coupled to the ground node and its drain coupled to node 106. Thus, when the EN* signal is high, n-channel transistor 118 is turned on to couple node 106 to ground to produce a low input into inverter 116 and a high output on F* line 60. When the EN* signal is brought low with the programming of anti-fuse 88 of single anti-fuse controlled programmable circuit 52, or with the PRG* signal going low to produce a high PRG signal on line 69, n-channel transistor 118 is turned off to enable the circuit to operate appropriately as described below.

In operation, when anti-fuse 108 is not programmed (left open) and anti-fuse 112 is programmed (shorted), node 106 is brought to Vcc or DVC2 (a high-logic level). The high-logic level is inverted by inverter 116 to provide a low or zero output on the F* signal on line 60. When anti-fuse 108 is programmed (shorted) and anti-fuse 112 is not programmed (left open), node 106 is tied to the ground node (a low-logic level). Inverter 116 inverts the low-logic level to provide a high or one output on the F* signal on line 60.

By programming one of either anti-fuse 108 or 112, the user of the DRAM, or other integrated circuit according to the present invention, can select the desired state of the output F* signal of anti-fuse controlled programmable circuit 50. As described above, dual anti-fuse controlled programmable circuit 50 is employed in match fuse bank 40 illustrated in FIGS. 2 and 3 for programming to respond to specific values of the address signal 42 for replacing primary circuit elements, such as row or columns of a DRAM, with redundant circuit elements. Dual anti-fuse controlled programmable circuit 50 is, however, alternatively embodied in a variety of circuit applications where a programming feature is required For example, multiple dual anti-fuse controlled programmable circuits 50 are employed to generate a fuse identification (ID) for an integrated circuit. The fuse ID is a pattern of binary digits which uniquely identify the integrated circuit chip and can be decoded after the chip is packaged or integrated onto a circuit board.

Dual anti-fuse controlled programmable circuit 50 is alternatively embodied in another form of the present invention to select a mode of operation in the integrated circuit. For example, the amount of refresh available in a memory integrated circuit can be controlled with multiple dual anti-fuse controlled programmable circuits 50, such as by selecting between 4K rows or 8K rows in a 64 Meg DRAM. Another mode of operation application is to utilize dual anti-fuse programmable circuit 50 for slowing down or speeding up the integrated circuit In another mode of operation application dual anti-fuse controlled programmable circuits 50 is employed to select either a fast page mode for a memory integrated circuit or an extended data out (EDO) mode for the memory integrated circuit In any of its implementations, the dual anti-fuse structure of dual anti-fuse controlled programmable circuit 50 of the present invention eliminates the need for a long-L p-channel pull-up transistor, such as long-L p-channel pull-up transistor 98 of single anti-fuse programmable circuit 52. In addition, the standby current resulting in conventional anti-fuse controlled programmable circuits, such as single anti-fuse controlled programmable circuit 52, resulting when the single anti-fuse is programmed or shorted to cause a resistive connection between the Vcc power supply and ground, is substantially eliminated with dual anti-fuse controlled programmable circuit 50. The standby current no longer exists because one of anti-fuses 108 or 112 remains open so that there is substantially no connection created between the Vcc power supply and ground.

The dual anti-fuse controlled programmable circuit 50 of the present invention occupies significantly less space m an integrated circuit than the conventional type single anti-fuse controlled programmable circuit 52. Assuming one n-channel transistor occupies approximately the same space as one p-channel transistor, there is the equivalent of one less normal p-channel transistor in the dual anti-fuse controlled programmable circuit 50, because n-channel transistor 118 replaces the two p-channel transistors 96 and 94. Most significantly, the long-L p-channel pull-up transistor 98 is completely eliminated in the dual anti-fuse controlled programmable circuit 50. Although the dual anti-fuse controlled programmable circuit 50 adds one anti-fuse over the single anti-fuse controlled programmable circuit 52, the additional space occupied by the additional anti-fuse is much less than the space needed for one normal p-channel transistor and one long-L p-channel transistor. Thus, the net effect is a significant savings in die area when the dual anti-fuse controlled circuits of the present invention are employed in an integrated circuit, such as in match anti-fuse bank circuit 40 of FIG. 3.

Conclusion

The match anti-fuse bank circuit according to the present invention utilizing the dual anti-fuse controlled programmable circuit 50 according to the present invention operates with only one of the dual anti-fuses being programmed. Therefore, no resistive short between the Vcc power supply and ground is established, which substantially decreases or eliminates current drawn through a blown or shorted anti-fuse to ground. This also eliminates the need for long-L p-channel transistors to pull up the anti-fuses, which provides a substantial area saving in the integrated circuit employing dual anti-fuse programmable circuits according to the present invention.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electromechanical electrical and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A method of programming an integrated circuit comprising:

providing an enable signal having a non-enable state and an enable state;

providing a programming signal having a programming state and a non-programming state;

providing a first power supply which is switchable between a first bus voltage and a VCC voltage;

providing a second power supply which is switchable between a second bus voltage and a ground voltage;

programming exactly one anti-fuse of a first anti-fuse and a second anti-fuse interposed between the first power supply and the second power supply based on switched states of both the first voltage supply and the second voltage supply and the programming signal being in the programming state, thereby substantially eliminating standby current between the first power supply and the second power supply; and providing a programmed signal from a programmable circuit, wherein the programmed signal has a first potential from the first power supply in response to the enable signal being in the enable state, the first anti-fuse being programmed and the second anti-fuse being unprogrammed, and the programmed signal has a second potential from the second power supply in response to the enable signal being in the enable state, the second anti-fuse being programmed and the first anti-fuse being unprogrammed;

wherein the programmed signal assumes a determined potential when exactly one of the first anti-fuse and the second anti-fuse is programmed.

2. A method of programming an integrated circuit comprising:

providing an enable signal having a non-enable state and an enable state;

providing a programming signal having a programming state and a non-programming state;

providing a first power supply which is switchable between a first bus voltage and a VCC voltage;

providing a second power supply which is switchable between a second bus voltage and a ground voltage;

programming exactly one anti-fuse of a first anti-fuse and a second anti-fuse interposed between the first power supply and the second power supply based on switched states of both the first voltage supply and the second voltage supply and the programming signal being in the programming state, wherein no long-L p-channel pull-up transistor is interposed between the first power supply and either anti-fuse and wherein no long-L p-channel pull-up transistor is interposed between the second power supply and either anti-fuse; and providing a programmed signal from a programmable circuit, wherein the programmed signal has a first potential from the first power supply in response to the enable signal being in the enable state, the first anti-fuse being programmed and the second anti-fuse being unprogrammed, and the programmed signal has a second potential from the second power supply in response to the enable signal being in the enable state, the second anti-fuse being programmed and the first anti-fuse being unprogrammed;

wherein the programmed signal assumes a determined potential when exactly one of the first anti-fuse and the second anti-fuse is programmed.

3. A method for producing a programmed signal, comprising:

receiving n address bits in an integrated circuit;

selecting primary circuit elements based on binary values of the n address bits; and coupling each of a plurality of programmable circuits to a first power supply and a second power supply;

producing a programmed signal from the plurality of programmable circuits corresponding to one of the possible binary values of at least one of the n address bits; and wherein producing the programmed signal includes:
 selectively coupling a first node to a first power supply by a first anti-fuse when in a programmed state and decoupling the first node from the first power supply when in an unprogrammed state; and
 selectively coupling the first node to a second power supply by a second anti-fuse when in a programmed state and decoupling the first node from the second power supply when in an unprogrammed state;
 assigning a determined state to the first node when exactly one of the first and second anti-fuses is in the programmed state; and
 basing the state of the programmed signal on the state of the first node.

4. A method for producing a programmed signal, comprising:

receiving n address bits in an integrated circuit;

selecting primary circuit elements based on binary values of the n address bits; and coupling each of a plurality of programmable circuits to a first power supply and a second power supply;

producing a programmed signal from the plurality of programmable circuits corresponding to one of the possible binary values of at least one of the n address bits;

wherein producing the programmed signal includes:
 selectively coupling a first node to a first power supply by a first anti-fuse when in a programmed state and decoupling the first node from the first power supply when in an unprogrammed state; and
 selectively coupling the first node to a second power supply by a second anti-fuse when in a programmed state and decoupling the first node from the second power supply when in an unprogrammed state;
 assigning a determined state to the first node when exactly one of the first and second anti-fuses is in the programmed state; and
 basing the state of the programmed signal on the state of the first node wherein selecting primary circuit elements includes:
 coupling a compare circuit to the plurality of programmable circuits;
 activating a match signal in response to all of the programmed signals being active;
 disabling a primary circuit element from being selected by a corresponding binary value of the n address bits based on the match signal; and
 enabling a redundant circuit element to be selected by the corresponding binary value of the n address bits.

5. The method of claim 3, wherein selectively coupling a first node to a first power supply by a first anti-fuse integrated circuit includes holding the first power supply at approximately Vcc.

6. The method of claim 3, wherein selectively coupling a first node to a first power supply by a first anti-fuse integrated circuit includes holding the first power supply at approximately Vcc/2.

7. The method of claim 3, wherein selectively coupling the first node to a second power supply by a second anti-fuse includes holding the second power supply at a ground potential.

8. A method, comprising:

selecting primary circuit elements based on binary values of n address bits;

coupling a programmable circuit to a first power supply and a second power supply;

providing a programmed signal corresponding to one of the possible binary values of at least one of the n address bits;

activating the programmed signal in response to a binary value of the at least one of the n address bits when the binary value of the at least one of the n address bits corresponds to the programmed signal;

wherein activating the programmed signal includes:
 selectively coupling a first node to a first power supply via a first anti-fuse when in a programmed state and decoupling the first node from the first power supply when in an unprogrammed state; and
 selectively coupling the first node to a second power supply via a second anti-fuse when in a programmed state and decoupling the first node from the second power supply when in an unprogrammed state;
 assigning a determined state to the first node when exactly one of the first and second anti-fuses is in the programmed state; and
 basing the state of the programmed signal is based on the state of the first node.

9. The method of claim 8, wherein selectively coupling a first node to a first power supply by a first anti-fuse integrated circuit includes holding the first power supply at approximately Vcc.

10. The method of claim 8, wherein selectively coupling a first node to a first power supply by a first anti-fuse integrated circuit includes holding the first power supply at approximately Vcc/2.

11. The method of claim 8, wherein selectively coupling the first node to a second power supply by a second anti-fuse includes holding the second power supply at a ground potential.

12. A method for providing a programmed signal in an integrated circuit, comprising:

coupling a first terminal of a first anti-fuse to a first node;

coupling a second terminal of the first anti-fuse to a first power supply via a first switch during a normal operation;

coupling a first terminal of the second anti-fuse to the first node;

coupling a second terminal of the second anti-fuse to a second power supply via a second switch during a normal operation;

carrying sufficient voltage on a first bus to short the first anti-fuse;

carrying sufficient voltage on a second bus to short the second anti-fuse;

during a first programming operation, operating the first switch to connect the first anti-fuse to the first bus for programming the first anti-fuse to electrically couple the second terminal of the first anti-fuse to the first power supply and providing a programming signal that connects the first node to ground;

during a second programming operation, operating the second switch to connect the second anti-fuse to the second bus for programming the second anti-fuse to electrically couple the second terminal of the second anti-fuse to the second power supply and providing a programming signal that connects the first node to ground; and providing an enable signal that selectively connects the first node to ground.

13. The method of claim 12, wherein operating the first switch includes sending a signal to a gate of a transistor to operate the switch.

14. The method of claim 12, wherein coupling the second anti-fuse to the second power supply includes holding the second power supply at a ground potential.

15. The method of claim 12, wherein only one of the first programming operation and the second programming operation can be performed such that only one of the first anti-fuse and the second anti-fuse can be programmed.

16. The method of claim 15, wherein performing only one of the first programming operation and the second programming operation includes substantially eliminating standby current between the first power supply and the second power supply.

17. The method of claim 12, wherein coupling the second anti-fuse to the second power supply includes holding thee second power supply at a ground potential and coupling the first anti-fuse to the first power supply includes holding the first power supply at one of Vcc or DVC2.

18. The method of claim 17, wherein only one of the first programming operation and the second programming operation can be performed such that only one of the first anti-fuse and the second anti-fuse can be programmed and no resistive short is established between the one of Vcc or DVC2 and the ground potential.

19. The method of claim 12, wherein no long-L p-channel pull-up transistor is interposed between the first power supply and either anti-fuse and wherein no long-L p-channel pull-up transistor is interposed between the second power supply and either anti-fuse.

20. A method of programming an integrated circuit, comprising:

providing an enable signal having a non-enable state and an enable state;

providing a programming signal having a programming state and a non-programming state;

programming exactly one anti-fuse of a first anti-fuse and a second anti-fuse interposed between a first power supply and a second power supply based on the programming signal being in the programming state, thereby substantially eliminating standby current between the first power supply and the second power supply;

providing a programmed signal from the programmable circuit, wherein the programmed signal has a first potential from the first power supply in response to the enable signal being in the enable state, the first anti-fuse being programmed and the second anti-fuse being unprogrammed, and the programmed signal has a second potential from the second power supply in response to the enable signal being in the enable state, the second anti-fuse being programmed and the first anti-fuse being unprogrammed;

wherein the programmed signal assumes a determined potential when exactly one of the first anti-fuse and the second anti-fuse is programmed; and selectively coupling a first node connected to both the first anti-fuse and the second anti-fuse to the second power supply regardless of the state of the first and second anti-fuses with the enable signal being in the non-enable state.

21. The method of claim 20, further comprising holding the first power supply at approximately Vcc.

22. The method of claim 20, further comprising holding the first power supply at approximately Vcc/2.

23. The method of claim 20, further comprising holding the second power supply at a ground potential.

24. The method of claim 20, wherein no long-L p-channel pull-up transistor is interposed between the first node and either the first or the second power supply.

25. A method of programming an integrated circuit, comprising:

providing an enable signal having a non-enable state and an enable state;

providing a programming signal having a programming state and a non-programming state;

programming exactly one anti-fuse of a first anti-fuse and a second anti-fuse interposed between a first power supply and a second power supply based on the programming signal being in the programming state, wherein no long-L p-channel pull-up transistor is interposed between the first power supply and either anti-fuse and wherein no long-L p-channel pull-up transistor is interposed between the second power supply and either anti-fuse;

providing a programmed signal from the programmable circuit, wherein the programmed signal has a first potential from the first power supply in response to the enable signal being in the enable state, the first anti-fuse being programmed and the second anti-fuse being unprogrammed, and the programmed signal has a second potential from the second power supply in response to the enable signal being in the enable state, the second anti-fuse being programmed and the first anti-fuse being unprogrammed;

wherein the programmed signal assumes a determined potential when exactly one of the first anti-fuse and the second anti-fuse is programmed; and selectively coupling a first node connected to both the first anti-fuse and the second anti-fuse to the second power supply regardless of the state of the first and second anti-fuses with the enable signal being in the non-enable state.

26. The method of claim 25, further comprising holding the first power supply at approximately Vcc.

27. The method of claim 25, further comprising holding the first power supply at approximately Vcc/2.

28. The method of claim 25, further comprising holding the second power supply at a ground potential.

29. The method of claim 25, wherein no long-L p-channel pull-up transistor is interposed between the first node and, either the first or the second power supply.

30. The method of claim 1, wherein providing the enable signal includes providing an EN* to a gate of a first transistor that has either its source or drain connected to a node intermediate the first anti-fuse and the second anti-fuse.

31. The method of claim 30, wherein providing the programming signal includes providing the programming signal to a gate of a second transistor that has either its source or drain connected to a node intermediate the first anti-fuse and the second anti-fuse.

32. The method of claim 31, wherein providing the programming signal includes providing a PRG* signal, FBSEL* signal, and an Am* signal to a logic circuit to produce the programming signal.

33. The method of claim 1, wherein providing the programming signal includes providing a PRG* signal, FBSEL* signal, and an Am* signal to a logic circuit to produce the programming signal.

34. The method of claim 4 wherein selectively coupling a first node to a first power supply by a first anti-fuse integrated circuit includes holding the first power supply at approximately Vcc.

35. The method of claim 4, wherein selectively coupling a first node to a first power supply by a first anti-fuse integrated circuit includes holding the first power supply at approximately Vcc/2.

36. The method of claim 4, wherein selectively coupling the first node to a second power supply by a second anti-fuse includes holding the second power supply at a ground potential.

* * * * *

UNITED STATES PATENT AND TRADEMARK OFFICE
CERTIFICATE OF CORRECTION

PATENT NO.   : 6,686,790 B2
DATED        : February 3, 2004
INVENTOR(S)  : Cutter et al.

It is certified that error appears in the above-identified patent and that said Letters Patent is hereby corrected as shown below:

Column 2,
Line 67, after "circuit" insert -- . --.

Column 3,
Line 42, after "circuit" insert -- . --.
Line 56, after "element" insert -- . --.

Column 4,
Line 22, after "FIG.5" insert -- is --.
Line 60, after "As" insert -- illustrated --.

Column 5,
Line 8, after "criteria" insert -- . --.
Line 27, delete "programing" and insert -- programming --, therefor.
Line 39, delete "pro-decoded" and insert -- pre-decoded --, therefor.

Column 7,
Line 56, delete "on with" and insert -- on. With --, therefor.

Column 8,
Line 65, after "required" insert -- . --.

Column 9,
Line 13, after "circuit" insert -- . --.

Signed and Sealed this

Twenty-second Day of June, 2004

JON W. DUDAS
*Acting Director of the United States Patent and Trademark Office*